US006972631B1

(12) United States Patent
Haman

(10) Patent No.: US 6,972,631 B1
(45) Date of Patent: Dec. 6, 2005

(54) RUBIDIUM FREQUENCY STANDARD CONTROL METHOD AND SYSTEM FOR VOLTAGE-CONTROLLED OSCILLATORS

(75) Inventor: Leo J. Haman, Cedar Rapids, IA (US)

(73) Assignee: Rockwell Collins, Cedar Rapids, IA (US)

( * ) Notice: Subject to any disclaimer, the term of this patent is extended or adjusted under 35 U.S.C. 154(b) by 60 days.

(21) Appl. No.: 10/740,018

(22) Filed: Dec. 18, 2003

(51) Int. Cl.[7] .................................................. H03L 7/26
(52) U.S. Cl. ............................................. 331/3; 331/14
(58) Field of Search .................................. 331/1 R, 3, 14, 331/94.1

(56) References Cited

U.S. PATENT DOCUMENTS 5,148,437 A * 9/1992 Ohtsu ........................... 372/32
6,570,455 B2 * 5/2003 Atsumi et al. ................. 331/3

* cited by examiner

Primary Examiner—Davis Mis
(74) Attorney, Agent, or Firm—Nathan O. Jensen; Kyle Eppele

(57) ABSTRACT

A rubidium frequency standard control circuit which utilizes an initial sweep hand-off frequency locking process followed by a negative feedback loop for optimization of the stability of the voltage control oscillator employing the rubidium frequency standard.

20 Claims, 1 Drawing Sheet

RUBIDIUM FREQUENCY STANDARD CONTROL METHOD AND SYSTEM FOR VOLTAGE-CONTROLLED OSCILLATORS

FIELD OF THE INVENTION

The present invention generally relates to electronics, and more particularly relates to voltage-controlled crystal oscillator (VCXO) circuits using a rubidium frequency standard, and even more particularly relates to methods and systems for controlling such circuits.

BACKGROUND OF THE INVENTION

In the past, it has been well known to use a rubidium frequency standard to enhance the frequency accuracy of certain voltage-controlled oscillators.

While these rubidium frequency standards have enjoyed much use and success in many applications in the past, they do have several shortcomings.

First of all, it is often necessary to use a dithering process with such standards. Such dithering often results in unwanted noise in the oscillator output. Also, prior art rubidium standards have exhibited difficulty in correcting for changes in ambient temperature and other environmental events.

Consequently, there exists a need for improved methods and systems for operating and controlling a VCXO having a rubidium frequency standard.

SUMMARY OF THE INVENTION

It is an object of the present invention to provide an oscillator with a rubidium standard with enhanced control characteristics.

It is a feature of the present invention to utilize an initial sweep scheme.

It is another feature to provide a method to use an initial sawtooth sweep.

It is another feature to provide a mechanism for starting a sawtooth sweep initially and terminating the sweep upon acquisition of a predetermined frequency.

It is another feature to automatically provide a feedback loop which regulates a voltage-controlled oscillator when the sweep is not being utilized.

It is an advantage of the present invention to provide for a low dithering noise, low power, low component part count, control for a VCXO with a rubidium frequency standard.

The present invention is a system and method for controlling a VCXO with a rubidium frequency standard which is designed to satisfy the aforementioned needs, provide the previously stated objects, include the above-listed features and achieve the already articulated advantages. The present invention is carried out in a dither-noiseless manner in the sense that noise resulting from intentional continuous dithering has been eliminated.

Accordingly, the present invention is a rubidium frequency standard control circuit which utilizes a sweep hand-off locking arrangement upon initialization and during recapture events.

BRIEF DESCRIPTION OF THE DRAWINGS

The invention may be more fully understood by reading the following description of the preferred embodiments of the invention, in conjunction with the appended drawings wherein.

DETAILED DESCRIPTION

Figure 1:
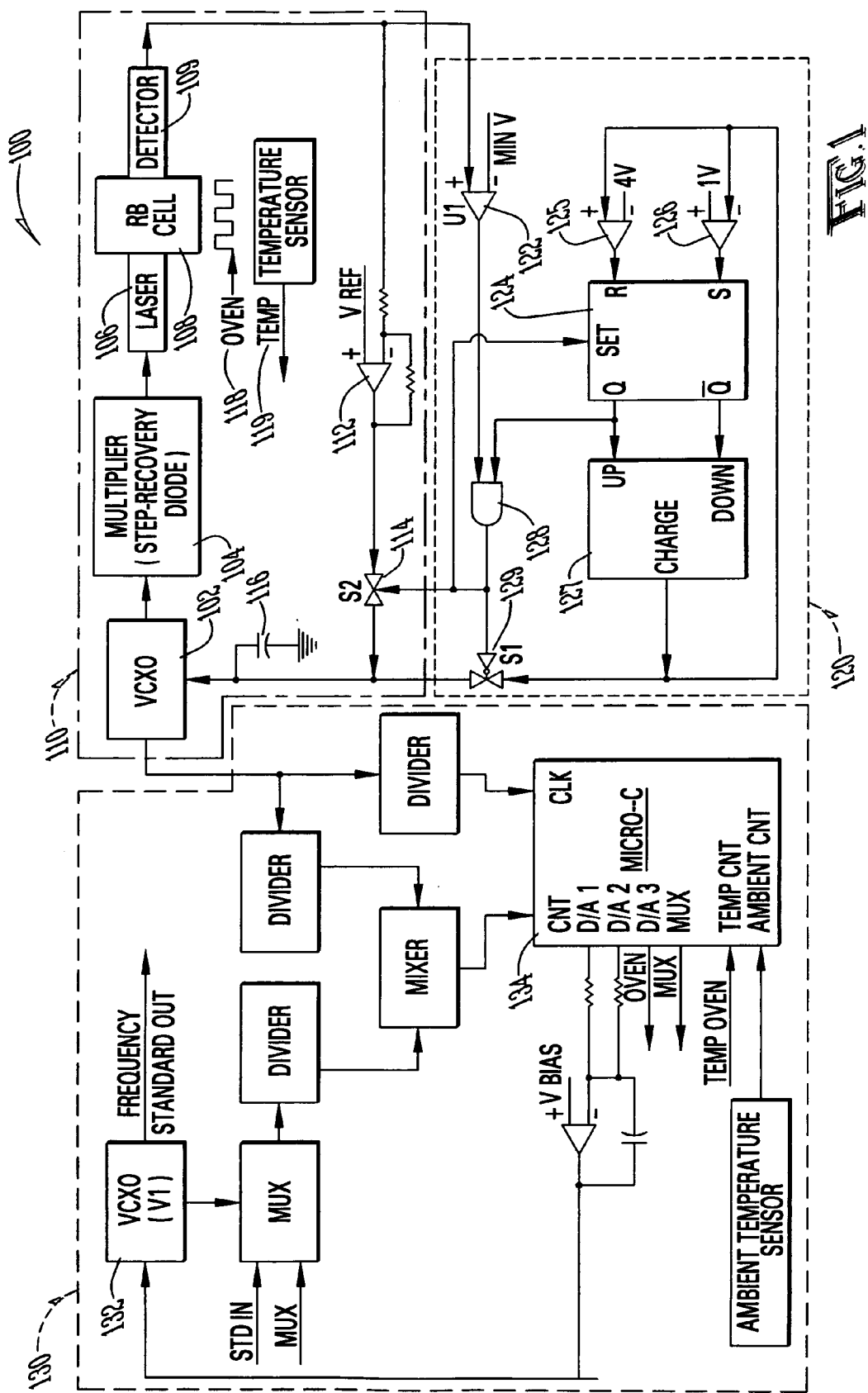
FIG. 1 is a block diagram of a VCXO with a rubidium frequency standard control circuit of the present invention.

Now referring to the drawings wherein like numerals refer to like matter throughout, there is shown an oscillator system generally designated 100 with a first oscillator system 110 (rubidium loop) outlined by dotted and dashed lines comprising a voltage-controlled crystal oscillator (VCXO) 102, which is well known in the art, to provide an output frequency which is proportional to the input voltage. Coupled to voltage-controlled crystal oscillator (VCXO) 102 is a multiplier 104 which could be a step-recovery diode such as a Schottkey diode for generating various odd harmonics of the output of voltage-controlled crystal oscillator (VCXO) 102. Coupled to multiplier 104 is a frequency modulated laser 106 which is coupled to a rubidium cell 108 and a detector 109. The rubidium cell 108 may be an entrapment of the gas comprised of the isotope rubidium 87 and buffer gases. The detector 109 may be a device that is photo-sensitive to radiation near the visible light region which detector has an output voltage proportional to the intensity of the radiation. The output of detector 109 is applied to feedback inverting amplifier 112 and then back to voltage-controlled crystal oscillator (VCXO) 102 via switch 114 and capacitor 116. In order for the oscillator system 110 (rubidium loop) to be stable (when using an inverting amplifier), the detector 109 output versus frequency slope must remain positive. As the nominal frequency is swept low to high, the detector 109 output changes from zero to maximum, and then back to zero. It is preferred, to maintain loop stability, that the operating point is on the front edge of the detector 109 versus frequency curve.

The oscillator system 110 is initially locked up by sweep generator and hand-off locking system 120 which is outlined with dotted lines. To initially lock up the rubidium loop, switch 114 is open, and switch 129 is closed. The charge circuit 127, in conjunction with the flip-flop 124 and two comparators, upper sawtooth limit comparator 125 and lower sawtooth limit comparator 126, provide a sawtooth output. Flip-flop 124 may be of the S-R type where a high input on S sets the output Q to a high state, and a high input on R resets the output Q to a low state. This output slews the voltage-controlled crystal oscillator (VCXO) 102 from low frequency to high when switch 114 is open and switch 129 is closed. Logic input to the AND gate 128 prevents switch 114 from closing and switch 129 from opening (preventing the loop from closing) when the sawtooth is varied from high to low. When detector 109 output starts to rise (as frequency is increased), comparator 122 goes high at its output, which can function to turn off the sawtooth generator by closing switch 114 and opening switch 129. It is at this point of the sweep that the open loop circuit hands off and locks the rubidium loop. If the rubidium loop is ever opened, by a loss of detector 109 output, comparator 122 will go low and the sawtooth automatically starts again to lock the loop by sweeping the voltage-controlled crystal oscillator (VCXO) 102 output frequency until one of the multiplier 104 harmonic outputs exactly coincides with the 3.47341307 GHz needed by the rubidium cell 108. At this frequency, the detector 109 output is again maximized and is then again used to open the switch 129 from the sawtooth generator and close the switch 114 that connects the feedback amplifier to the voltage-controlled crystal oscillator (VCXO) 102 input. This automatic initiating process can be referred to as sweep hand-off locking.

In an exemplary embodiment, the sweep hand-off locking is allowed to take place only when the sawtooth generator signal is rising. The rubidium loop is then always locked, for maximum sensitivity on the maximum slope of the rising edge of the detector 109 output. The sweep generator and hand-off locking system 120 immediately disable driving the voltage-controlled crystal oscillator (VCXO) 102 when the rubidium loop is locked, thereby decreasing noise and saving power. The sweep generator and hand-off locking system 120 automatically starts driving the voltage-controlled crystal oscillator (VCXO) 102 when the detector 109 output is ever lost or the rubidium loop is no longer locked. There is no dithering of the voltage-controlled crystal oscillator (VCXO) 102 frequency once the rubidium loop is locked.

The voltage-controlled crystal oscillator (VCXO) 102 has an output which is a sub-multiple of the rubidium frequency and is often not usable alone. A frequency locked offset VCXO system 130 is locked to the rubidium loop frequency through a series of dividers, a mixer and the microcontroller 134, thereby allowing standard output frequencies, such as 10 MHz, 50 MHz or any nominal value. Microcontroller 134 can be used to compensate for temperature and other environmental effects by storing a calibrated compensation value in a nonvolatile memory.

Several features of the "Rubidium Frequency Standard with Sweep Hand- off Locking" are summarized as follows:

1. The "Sweep Hand-off Locking" is allowed to take place only when the sawtooth signal is rising. The rubidium loop is then always locked, for maximum sensitivity, on the maximum slope of the rising edge of the detector output.
2. The sawtooth circuitry is immediately disabled when the rubidium loop is locked, saving power and decreasing noise.
3. The "Sweep Hand-off Locking" automatically restarts if the detector output is ever momentarily lost or the rubidium loop unlocks.
4. There is no dithering of the VCXO frequency once the rubidium loop is locked. This eliminates the dithering noise from the output.
5. An integrator-controlled output VCXO which is frequency locked to the rubidium loop VCXO through a series of dividers, a mixer and the Microcontroller counter, allows standard output frequencies (e.g. 10,000,000 Hz, 50,000,000 Hz, or any nominal value required).
6. The integrator-controlled output VCXO provides a low-noise frequency output.
7. The Microcontroller can be used to compensate for temperature and other environmental effects. This compensation can be stored in the Microcontroller nonvolatile memory.

The above description is focused around a rubidium standard It should be understood that the present invention could be used with other standards, such as Cesium or any other suitable material. When such changes are made, then the details of voltages, frequencies, etc., would be changed as well. It is believed that the notion of alternating between a feedback control and an acquisition sweep could be readily adapted to various alternate embodiments.

In view of the high level of skill in the art known by designers of prior art VCXOs with rubidium frequency standards, it is thought that the method and apparatus of the present invention will be understood from the foregoing description, and that it will be apparent that various changes may be made in the form, construct steps and arrangement of the parts and steps thereof, without departing from the spirit and scope of the invention or sacrificing all of their material advantages. The form herein described is merely a preferred exemplary embodiment thereof.

I claim:

1. An oscillator system comprising:
   a voltage-controlled oscillator, configured for providing a variable frequency output;
   a frequency modulated laser which is configured to be responsive to said variable frequency output;
   an optical frequency discriminator which is configured to maximize passage of a predetermined optical frequency;
   an optical detector configured for detection of an optical signal passing through said optical frequency discriminator and generating a variable voltage in response thereto;
   a feedback loop for locking said voltage-controlled oscillator on an output frequency in response to said variable voltage; and,
   a non-continuous sweeping control voltage source coupled to and configured to provide a variable control voltage to said voltage-controlled oscillator only when said output frequency of said voltage-controlled oscillator is outside of a predetermined range.

2. A system of claim 1 wherein said optical frequency discriminator comprises a rubidium cell.

3. A system of claim 2 wherein said non-continuous sweeping control voltage source provides a sawtooth voltage waveform having predetermined upper and lower voltage bounds.

4. A system of claim 3 wherein said non-continuous sweeping control voltage source is deactivated in response to a comparison of said variable voltage with a predetermined voltage.

5. A system of claim 4 wherein said feedback loop is a negative feedback loop which inverts and amplifies said variable voltage.

6. A system of claim 2 further comprising a multiplier disposed between said voltage-controlled oscillator and said frequency modulated laser.

7. A system of claim 6 further comprising;
   a frequency locked offset VCXO system; and,
   an oven and oven control configured to heat said rubidium cell; and,
   a temperature sensor, configured to provide an ambient temperature.

8. A system of claim 6 wherein said multiplier comprises a step recovery diode.

9. A system of claim 8 wherein said step recovery diode comprises a Schottkey diode.

10. A system of claim 9 wherein said rubidium cell comprises rubidium gas.

11. An oscillator system comprising:
    means for producing a variable frequency output signal in response to a varying voltage input;
    means for producing variable optical radiation in response to an input signal of varying frequency;
    means for discriminating passage of optical radiation as a function optical frequency;
    means for detecting optical radiation and generating a variable voltage in response thereto;
    means for feeding back said variable voltage so as to lock said variable frequency output signal;
    means for generating said varying voltage input; and,
    means for alternating between using said means for feeding back and said means for generating.

12. A system of claim 11 further comprising:
    means for creating an oscillator signal which is frequency locked to but off set from said variable frequency output signal.

13. A system of claim 11 further comprising:
means for multiplying said variable frequency output signal to a plurality of harmonics.

14. A system of claim 13 wherein said varying voltage input is a signal having a sawtooth waveform.

15. A system of claim 14 wherein said means for generating further comprises an upper sawtooth limit comparator and a lower sawtooth limit comparator.

16. A system of claim 15 wherein said means for generating further comprises a flip-flop coupled to said upper sawtooth limit comparator and said lower sawtooth limit comparator.

17. A system of claim 11 wherein said means for alternating further comprises comparator and an AND gate.

18. A system of claim 12 wherein said means for feeding back comprises an inverter amplifier.

19. A system of claim 18 further comprising means for multiplying said variable frequency output signal to a plurality of harmonics.

20. A method of controlling a rubidium oscillator comprising the steps of:
providing a crystal oscillator, a rubidium cell and a feedback loop to precisely control a variable frequency output of said crystal oscillator;
providing a control voltage signal to said crystal oscillator where said control voltage signal has a sawtooth voltage characteristic; and,
providing a switching mechanism for alternating between responding to input from said feedback loop and said control voltage signal.

* * * * *